(12) United States Patent
Hung et al.

(10) Patent No.: US 11,073,852 B2
(45) Date of Patent: Jul. 27, 2021

(54) ELECTRONIC LOAD APPARATUS

(71) Applicant: CHROMA ATE INC., Taoyuan (TW)

(72) Inventors: Chun-Sheng Hung, Taoyuan (TW); Hsiang-Yu Wu, Taoyuan (TW); Chi-Chiao Cheng, Taoyuan (TW); Chien-Hsing Huang, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 0 days.

(21) Appl. No.: 17/091,007

(22) Filed: Nov. 6, 2020

(65) Prior Publication Data

US 2021/0200251 A1     Jul. 1, 2021

(30) Foreign Application Priority Data

Dec. 31, 2019   (TW) .................................. 108148729

(51) Int. Cl.
*G05F 1/46*     (2006.01)
*G01R 31/385*   (2019.01)
*G01R 1/20*     (2006.01)

(52) U.S. Cl.
CPC .............. *G05F 1/46* (2013.01); *G01R 1/203* (2013.01); *G01R 31/386* (2019.01)

(58) Field of Classification Search
None
See application file for complete search history.

(56) References Cited

U.S. PATENT DOCUMENTS

| | | | | |
|---|---|---|---|---|
| 6,324,042 B1* | 11/2001 | Andrews | ............... | G01R 31/00 361/93.2 |
| 6,703,813 B1* | 3/2004 | Vladislav | ............... | G05F 1/575 323/270 |
| 7,161,338 B2* | 1/2007 | Jiang | ...................... | G05F 1/565 323/272 |
| 8,810,220 B2* | 8/2014 | Bai | ......................... | H04R 1/04 323/280 |
| 9,547,324 B2* | 1/2017 | Vahid Far | ............... | G05F 3/262 |
| 10,481,193 B2* | 11/2019 | Katz | ............... | H03K 19/00384 |
| 2008/0150547 A1* | 6/2008 | Wong | .................... | G01R 31/40 324/555 |

* cited by examiner

Primary Examiner — Thomas J. Hiltunen
(74) Attorney, Agent, or Firm — WPAT, PC (57) ABSTRACT

An electronic load apparatus is provided and adapted to allow an enhanced driving circuit to be disposed between a voltage-dividing circuit and power components to ensure the driving capability of the power components not coupled to a control circuit to thereby adjust a response voltage quickly, shorten a response time period and thus increase overall response speed, suppress transient voltage variation and thus preclude a signal delay otherwise arising from a load circuit, allow the power components series-connected in an electronic load apparatus to be driven quickly, reduce the risk of damaging the power components, and enhance the stability and reliability of the electronic load apparatus.

7 Claims, 8 Drawing Sheets

(PRIOR ART)

(PRIOR ART)

(PRIOR ART)

ELECTRONIC LOAD APPARATUS

BACKGROUND OF THE INVENTION

Field of the Invention

The present disclosure relates to apparatuses for use in testing and, more particularly, to an electronic load apparatus for testing electric power devices.

Description of the Prior Art

Electric power devices are indispensable to all types of apparatuses nowadays and are adapted to drive circuit units in the apparatuses and maintain a voltage level. Therefore, the stability of the apparatuses depends on the reliability of the electric power devices.

Electronic load apparatuses simulate a power consumption state. In the field of electric power testing, electronic loads provide all types of testing modes and thus are indispensable to the development and manufacturing of electric power devices. The operating principle of the electronic loads involves controlling the ON rate of internal power components, so as to simulate a power consumption environment in accordance with the power consumption of the power components.

Conventionally, a single power transistor functions as the power-stage circuit in an electronic load apparatus. As a result, the degree of voltage resistance of the power transistor places a limitation on the maximum operating voltage of the electronic load apparatus. However, an electronic load apparatus incurs high cost when equipped with a single power transistor with greater voltage resistance.

Figure 1:
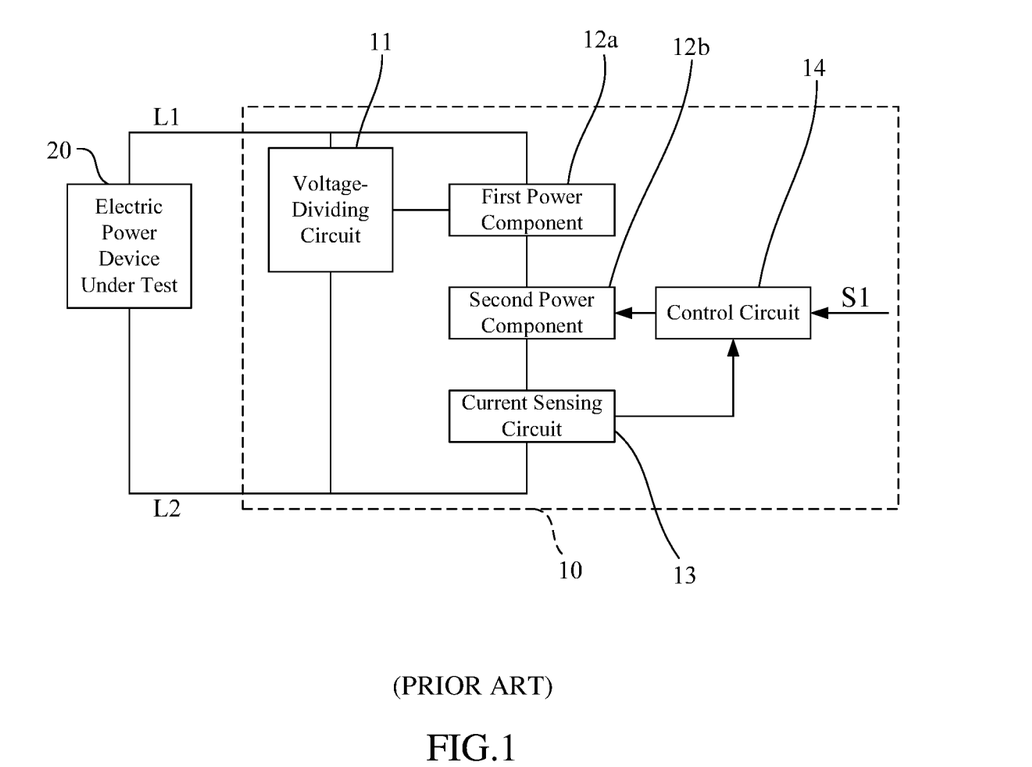
FIG. 1 (PRIOR ART) is a block diagram of a conventional electronic load system with dual power components.

Another approach to enhancement of voltage resistance is based on series-connected power transistors. FIG. 1 is a block diagram of a conventional electronic load system with dual power components. In an electronic load apparatus 10, the upper limit of the operating voltage of the electronic load is increased by connecting a first power component 12a and a second power component 12b in series. For instance, the voltage resistance of the electronic load is increased to a maximum of A+B by connecting the first power component 12a with voltage resistance A and the second power component 12b with voltage resistance B in series.

As shown in FIG. 1, when an electric power device under test 20 and the electronic load apparatus 10 are operating, a voltage-dividing circuit 11 generates a cross voltage to be applied to the first power component 12a according to the voltage supplied by the electric power device under test 20, whereas the second power component 12b is placed under the control of a control circuit 14 to thereby control internal ON rate (duty cycle). The control circuit 14 generates, according to an adjustment control signal S1 and a feedback signal of a current sensing circuit 13, a signal for controlling the second power component 12b, so as to set the level of the load current passing through the first power component 12a, second power component 12b, and current sensing circuit 13.

Since the voltage resistance of the electronic load apparatus 10 is jointly sustained by series-connected power components, the points in time at which individual power components are turn ON are of vital importance. In the situation where some power components have not yet been sufficiently turned ON but the others have, the power components which have not yet been sufficiently turned ON must sustain the voltage output by the electric power device under test 20 first, thereby causing damage to the power components.

Referring to FIG. 1, the gate of the second power component 12b is controlled by the control circuit 14, whereas the voltage-dividing circuit 11 provides a voltage-dividing voltage to the gate of the first power component 12a. Upon alteration of the voltage of the electric power device under test 20, the load circuit is likely to end up with an overly long transient response time period; as a result, the speed of the ON voltage which the voltage-dividing circuit 11 provides to the gate of the first power component 12a deceases, and thus the driving capability and the changing speed of the control circuit 14 are faster than the time period of the driving of the voltage-dividing circuit 11. As a result, the first power component 12a cannot be synchronized with the ON state of the second power component 12b, and thus the first power component 12a which has not yet been sufficiently turned ON must sustain the voltage output by the electric power device under test 20 first. Thus, the first power component 12a is exposed to the risk of destruction. As soon as the voltage output by the electric power device under test 20 is greater than the voltage resistance which the first power component 12a can sustain, the destruction happens, causing the electronic load system of the dual power components to malfunction.

SUMMARY OF THE INVENTION

It is an objective of the present disclosure to solve problems with overly long transient response time periods in an electronic load apparatus.

Another objective of the present disclosure is to render the electronic load apparatus capable of quickly providing adequate driving forces to power components.

Yet another objective of the present disclosure is to prevent failures of the electronic load apparatus and enhance its stability and reliability.

In order to achieve the above and other objectives, the present disclosure provides an electronic load apparatus, coupled to an electric power device under test by an upper loop and a lower loop, the electronic load apparatus comprising: a voltage-dividing circuit coupled between the upper loop and the lower loop; a plurality of power components and a current sensing circuit, coupled between the upper loop and the lower loop and sequentially series-connected; and a control circuit coupled to one of the power components and coupled to the current sensing circuit, wherein an enhanced driving circuit is coupled between the voltage-dividing circuit and each of the other power components and adapted to amplify the preceding current to a succeeding current in a preceding region according to a preceding current received from the voltage-dividing circuit and by inputting an external electric power of the enhanced driving circuit, and then in a succeeding region of the enhanced driving circuit a voltage generated according to the succeeding current is applied to the corresponding power component.

In an embodiment of the present disclosure, the preceding region of the enhanced driving circuit comprises a current gain unit, and the succeeding region of the enhanced driving circuit comprises an impedance unit coupled between the current gain unit and the corresponding power component, wherein the current gain unit amplifies the preceding current to the succeeding current, and the impedance unit generates, according to the succeeding current, the control voltage for driving the corresponding power component.

In an embodiment of the present disclosure, the enhanced driving circuit further comprises a voltage clamping unit, has an input side defined with a first voltage level point, and has an output side defined with a second voltage level point, such that the voltage clamping unit is coupled between the first voltage level point and the second voltage level point and adapted to ensure that the voltage level of the second voltage level point is equal to the voltage level of the first voltage level point.

In an embodiment of the present disclosure, the voltage clamping unit functions as a path which is turned ON when the voltage level of the second voltage level point is greater than the voltage level of the first voltage level point by a threshold, so as to ground the second voltage level point.

In an embodiment of the present disclosure, the enhanced driving circuit is also coupled between the control circuit and the one of the power components and adapted to amplify a current transmitted by the control circuit and generate a voltage applied to the one of the power components.

In an embodiment of the present disclosure, the power components, the current sensing circuit, the control circuit, and the enhanced driving circuits together form a power stage, wherein a parallel connection driving circuit is coupled between the voltage-dividing circuit and the enhanced driving circuits and adapted to effect parallel-connection of the power stages, so as to increase a load current of the electronic load apparatus. The parallel connection driving circuit has the same circuit framework as the current gain unit, amplifies a current transmitted by the voltage-dividing circuit, and provides the amplified current to the enhanced driving circuits connected to a back end.

In an embodiment of the present disclosure, an enhanced driving circuit is disposed between a voltage-dividing circuit and power components to ensure the driving capability of the power components not coupled to a control circuit to thereby adjust a response voltage quickly, shorten a response time period and thus increase overall response speed, suppress transient variation and thus preclude a delay otherwise arising from a load circuit, allow the power components in an electronic load apparatus to be driven quickly despite variation in the voltage of an electric power device under test, and enhance the stability and reliability of the electronic load apparatus.

DETAILED DESCRIPTION OF THE EMBODIMENTS

The technical characteristics, contents, advantages and effects of the present invention will become apparent from the following detailed description taken with the accompanying drawing.

Singular quantitative expressions, such as "a," "an," and "one", used herein are descriptive of units, elements, structures, devices, circuits, systems, locations or regions to not only facilitate illustration but also generally define the scope of the present disclosure. Therefore, unless otherwise specified clearly, the expressions must be interpreted in such a manner to mean "one or more" and include their plural forms.

Expressions, such as "comprise", "include", "have" and the like, used herein are not limited to essential components of the present disclosure but include any other essential components not definitely disclosed by the present disclosure, yet they are usually intrinsic to the units, elements, structures, devices, circuits, systems, locations or regions.

Ordinal numbers, such as "first" and "second," used herein are intended to distinguish or correlate identical or similar components or structures and do not necessarily imply what order the units, elements, structures, devices, circuits, systems, locations or regions are in in terms of space. It is understood that in some situations or arrangements, the ordinal numbers may be swapped without affecting the effects of implementation of the present disclosure.

The expression "start" used herein to describe the operation of transistors refers to the ON mode of transistors, wherein a current flows between the drain and source (or between the collector and emitter of a bipolar junction transistor (BJT)). The expression "start" used herein refers to the saturation mode or linearity/resistance mode of transistors. Examples of ON state include the linearity, saturation, or operating mode of a triode or field-effect transistor (FET) or the forward operating or saturation mode of BJT. The expression "shut down" used herein refers to non-ON state of transistors, wherein no current flows between the drain and source (or between the collector and emitter of BJT). Examples of OFF state include cut-off, subthreshold voltage, or weak reverse mode of PET or cut-off mode of BJT.

The expression "power components" used herein are bipolar junction transistors (BJT), metal-oxide-semiconductor field-effect transistors (MOSFET), insulated gate bipolar transistors (IGBT) and analogous power components.

Figure 2:
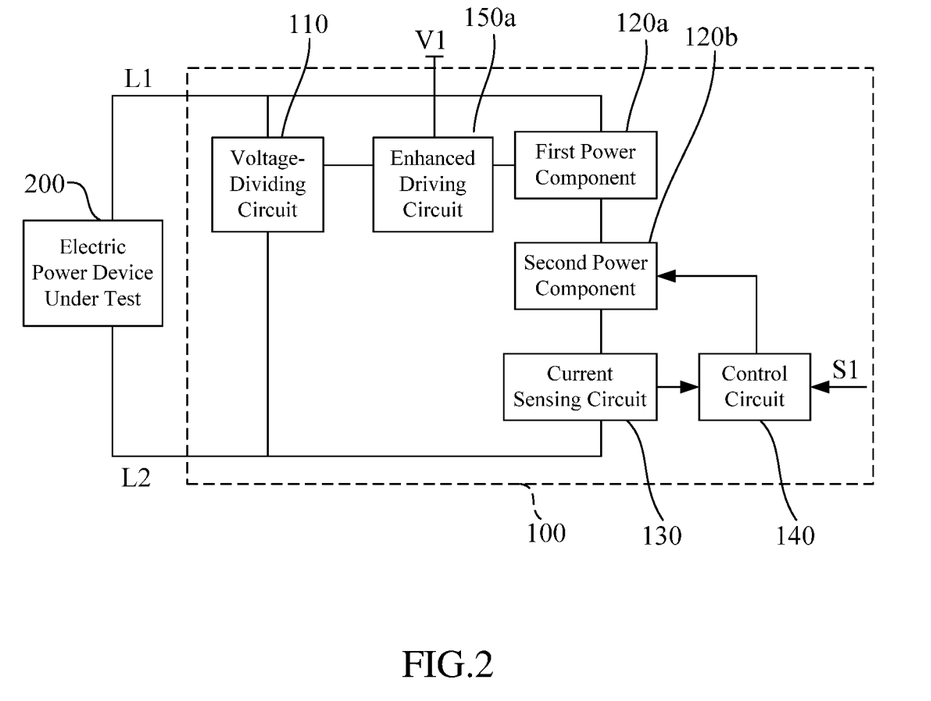
FIG. 2 is a circuit schematic view of an electronic load system according to an embodiment of the present disclosure.

Referring to FIG. 2, there is shown a circuit schematic view of an electronic load system according to an embodiment of the present disclosure. The electronic load system performs tests on an electric power device under test 200 in various modes, such as constant current mode, constant voltage mode, constant power mode and constant resistance mode. In the embodiment illustrated by FIG. 2, an electronic load apparatus 100 is coupled to the electric power device under test 200 by an upper loop L1 and a lower loop L2.

The electronic load apparatus 100 comprises a voltage-dividing circuit 110, a current sensing circuit 130, and a control circuit 140. The voltage-dividing circuit 110 is coupled between the upper loop L1 and the lower loop L2. The current sensing circuit 130 is also coupled between the upper loop L1 and the lower loop L2 and sequentially series-connected to a first power component 120a and a second power component 120b from behind. The control circuit 140 is coupled between the second power component 120b and the current sensing circuit 130 and adapted to adjust a load current passing through the first power component 120a and the second power component 120b according to a sensing result signal fed back by the current sensing circuit 130 and an adjustment control signal S1 operated.

As shown in FIG. 2, an enhanced driving circuit 150a is coupled between the first power component 120a and the voltage-dividing circuit 110. The enhanced driving circuit 150a has a preceding region and a succeeding region. The preceding region receives a preceding current from the voltage-dividing circuit 110. The preceding region amplifies the preceding current to a succeeding current, using an external electric power V1 input to the enhanced driving circuit 150a. Then, in the succeeding region, the enhanced driving circuit 150a generates a voltage according to the succeeding current and applies the voltage to the first power component 120a.

With the enhanced driving circuit 150a, the voltage applied to the first power component 120a is quickly generated due to amplification gain effect of current. Thus, as soon as the electric power device under test 200 delivers electric power to the power components, the series-connected power components are turned on and effectively attain respective voltage resistance capability, thereby enhancing the overall voltage resistance of the electronic load apparatus 100.

Figure 3:
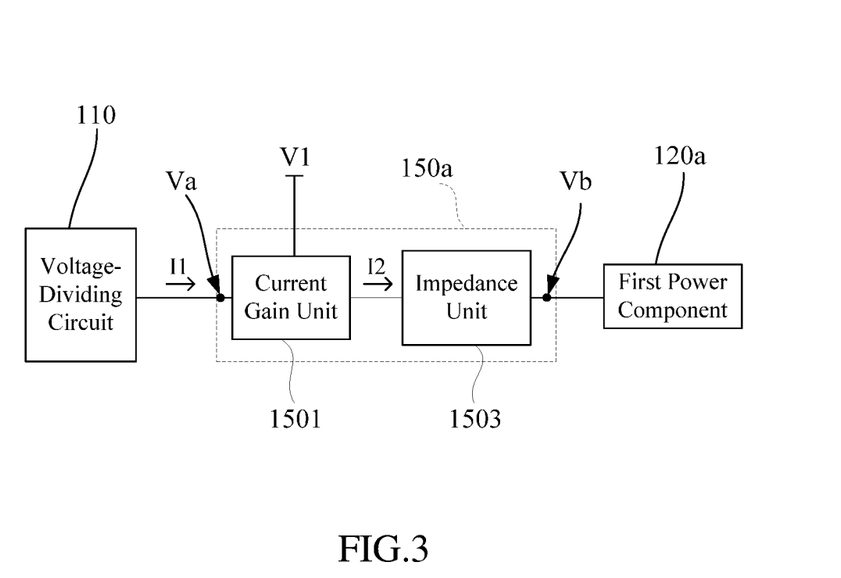
FIG. 3 is a circuit schematic view of an enhanced driving circuit according to an embodiment of the present disclosure.

Referring to FIG. 2 and FIG. 3, there is shown in FIG. 3 a circuit schematic view of an enhanced driving circuit 150a according to an embodiment of the present disclosure. The preceding region of the enhanced driving circuit 150a comprises a current gain unit 1501. The succeeding region of the enhanced driving circuit 150a comprises an impedance unit 1503. The impedance unit 1503 is coupled between the current gain unit 1501 and the corresponding power component 120a.

The current gain unit 1501 generates the succeeding current I2 according to an input of the preceding current I1. The succeeding current I2 passes through the impedance unit 1503 (such as a resistor) functioning as the succeeding region, such that a voltage under which the first power component 120a is quickly turned ON is generated and applied to the gate of the first power component 120a.

With the current gain unit 1501, once the preceding current I1 is input, the preceding current I1 can be quickly amplified to become the succeeding current I2. Then, with the impedance unit 1503, a voltage under which the first power component 120a can be sufficiently turned on is quickly generated at second voltage level point Vb. The extent to which the preceding current I1 undergoes gain amplification matches the ON voltage required for the corresponding power component because of the impedance unit 1503.

For instance, in all the embodiments of the present disclosure, the current gain unit 1501 can be provided in the form of circuit framework of Darlington pair (current gain increases, because the product of current magnifying powers of the series-connected transistors is used as a new current magnifying power for the output current) or any other circuit framework, provided that the current gain unit 1501 is effective in amplifying a current.

Figure 4:
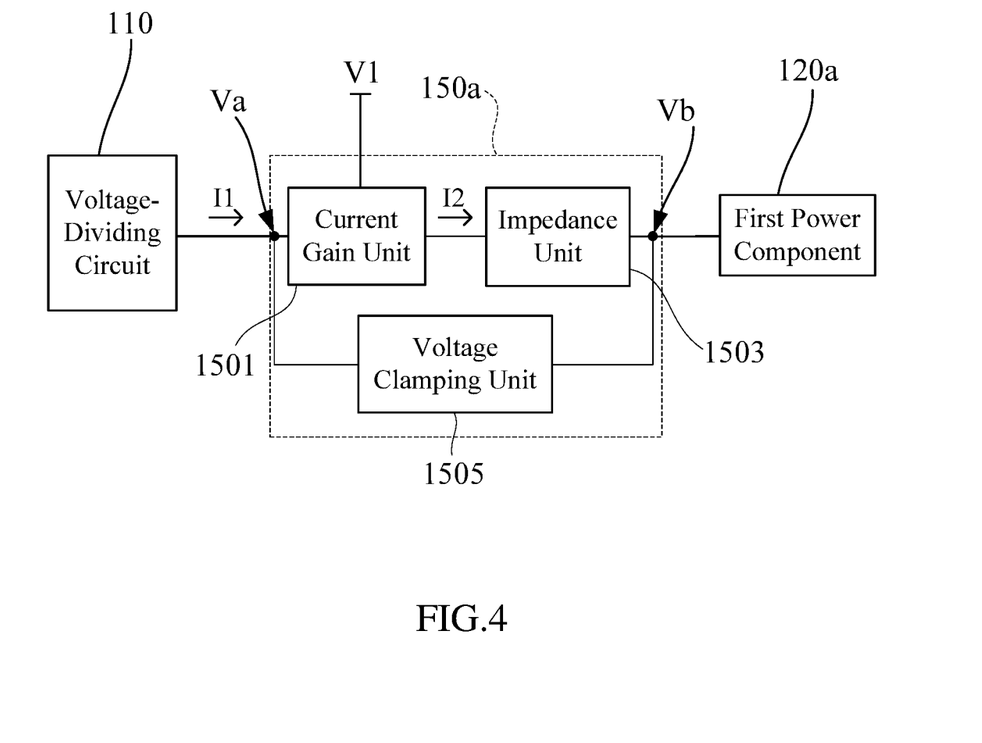
FIG. 4 is a circuit schematic view of the enhanced driving circuit according to another embodiment of the present disclosure.

Referring to FIG. 4, there is shown a circuit schematic view of the enhanced driving circuit according to another embodiment of the present disclosure. Unlike the embodiment illustrated by FIG. 3, the embodiment illustrated by FIG. 4 is characterized in that the enhanced driving circuit 150a further comprises a voltage clamping unit 1505. The input side of the enhanced driving circuit 150a is defined with first voltage level point Va. The output side of the enhanced driving circuit 150a is defined with second voltage level point Vb. The voltage clamping unit 1505 is coupled between the first voltage level point Va and the second voltage level point Vb. The voltage level under which the voltage clamping unit 1505 maintains the second voltage level point Vb is equal to the voltage level at the first voltage level point Va.

The voltage clamping unit 1505 may cause slight dropout voltage. Thus, the voltage clamping unit 1505 ensures that the dropout voltage between the voltage level of the first voltage level point Va and the voltage level of the second voltage level point Vb is less than a threshold. When the voltage level of the second voltage level point Vb is greater than the voltage level of the first voltage level point Va by the threshold, the path of the grounding of the second voltage level point Vb is turned on by the voltage clamping unit 1505. However, this grounding path will not be turned on (this grounding path will be in OFF state) in case of another dropout voltage between the voltage level of the first voltage level point Va and the voltage level of the second voltage level point Vb. The grounding refers to the grounding of the electronic load apparatus 100.

Therefore, the voltage clamping unit 1505 functions as a switch device and is, for example, provided in the form of an electronic component, such as a transistor, or any analogous component. Furthermore, when the voltage clamping unit 1505 does not cause dropout voltage, the threshold can be equal to zero; thus, the grounding path will be turned on, if the voltage level of the second voltage level point Vb is greater than the voltage level of the first voltage level point Va.

When the electric power under test is input to the electronic load apparatus 100, undesirable stray phenomenon occurs between the drain and gate of each power component, thereby allowing the gate to generate an additional voltage. The additional voltage affects the voltage distribution or uniform voltage initially to be controlled on the gate of each power component, and thus the voltage at the gate of each power component is increased to the detriment of overall matching degree. Therefore, the voltage clamping unit 1505 prevents this phenomenon.

Therefore, if the additional voltage is generated, the additional voltage can be effectively eliminated according to whether the grounding path is turned ON or not and according to the corresponding threshold, such that the voltage at the gate of each power component is restricted to an expected control level; thus, configuration of the uniform voltage or voltage distribution remains unaffected, thereby further enhancing stability.

Figure 5:
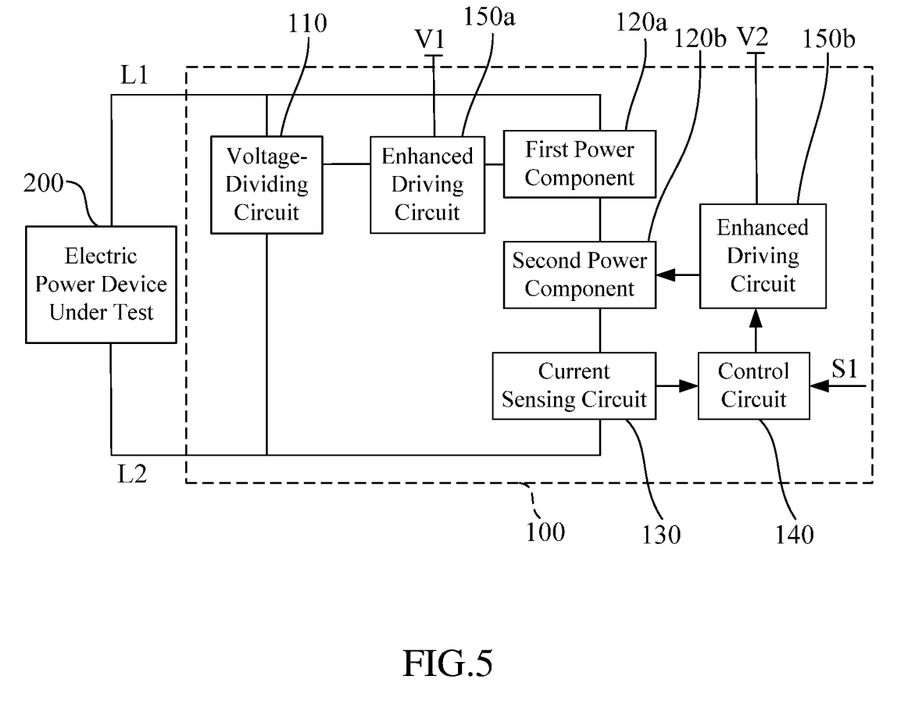
FIG. 5 is a circuit schematic view of the electronic load system according to another embodiment of the present disclosure.

Referring to FIG. 5, there is shown a circuit schematic view of the electronic load system according to another embodiment of the present disclosure. In the embodiment illustrated by FIG. 5, an enhanced driving circuit 150b of the aforesaid circuit structure is disposed between the second power component 120b and the control circuit 140. The enhanced driving circuit 150b amplifies the current transmitted by the control circuit 140 and thereby generates a voltage to be applied to the second power component 120b. The enhanced driving circuit 150b receives an external electric power V2. The external electric power V1 is different from the external electric power V2. The circuit shown in FIG. 5 ensures that the power components coupled to the voltage-dividing circuit 110 and the power component coupled to the control circuit 140 are driven by an enhanced driving circuit of the same circuit structure, such that the power components are operated in a uniform voltage state to thereby enhance the stability and reliability of the electronic load apparatus. In another embodiment, more power components are series-connected between the first power component 120a and the second power component 120b, whereas the enhanced driving circuit is coupled between the voltage-dividing circuit 110 and the additionally series-connected power components, such that the electronic load apparatus 100 not only has greater voltage resistance but is also unlikely to malfunction, thereby enhancing stability and reliability.

Figure 6:
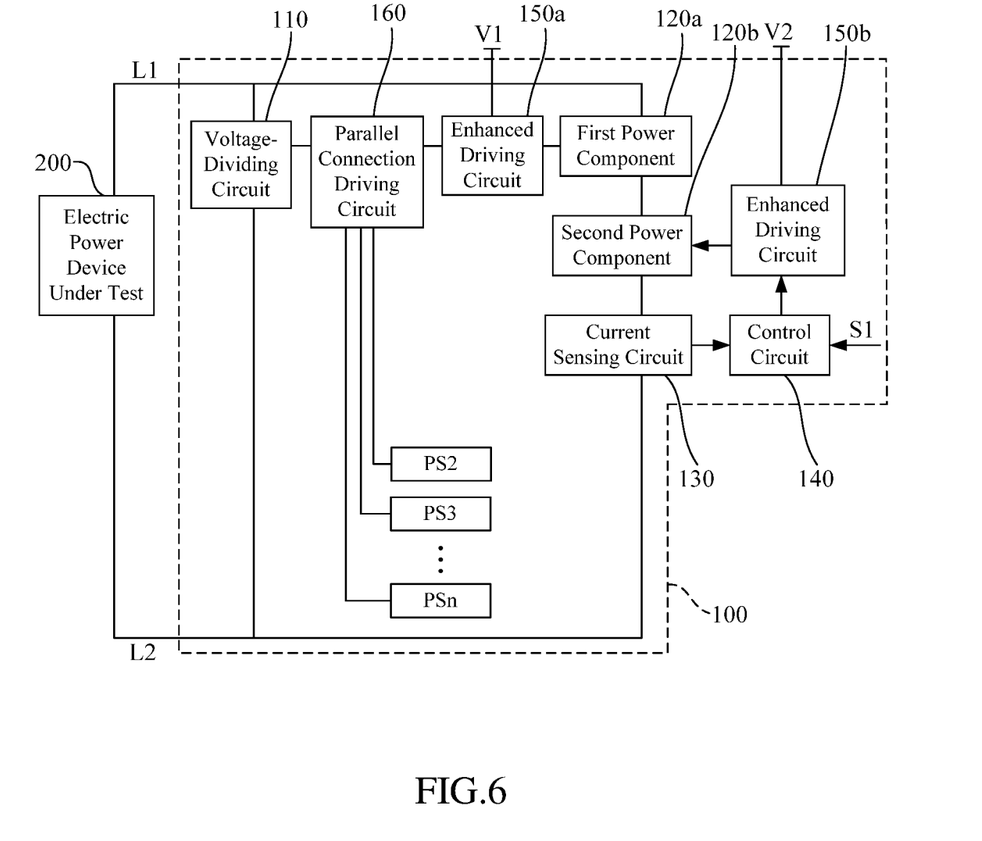
FIG. 6 is a circuit schematic view of the electronic load system according to yet another embodiment of the present disclosure.

Referring to FIG. 6, there is shown a circuit schematic view of the electronic load system according to yet another embodiment of the present disclosure. In the embodiment illustrated by FIG. 6, a parallel connection driving circuit 160 is coupled between the enhanced driving circuit 150a and the voltage-dividing circuit 110. The power components (120a, 120b), the current sensing circuit 130, the control circuit 140, and the enhanced driving circuit 150a together form a power stage, i.e., first power stage. Owing to the parallel connection driving circuit 160, it is feasible to further amplify the current and effectively drive the parallel-connected power stages, for example, second power stage PS2, third power stage PS3 through nth power stage PSn. The parallel-connected power stages are for use in increasing the load current of the electronic load apparatus to enable the electronic load apparatus to operate flexibly.

The parallel connection driving circuit 160 has the same circuit framework as the current gain unit 1501, amplifies the current transmitted by the voltage-dividing circuit 110, and provides the amplified current to the enhanced driving circuits connected to the back end.

Figure 7:
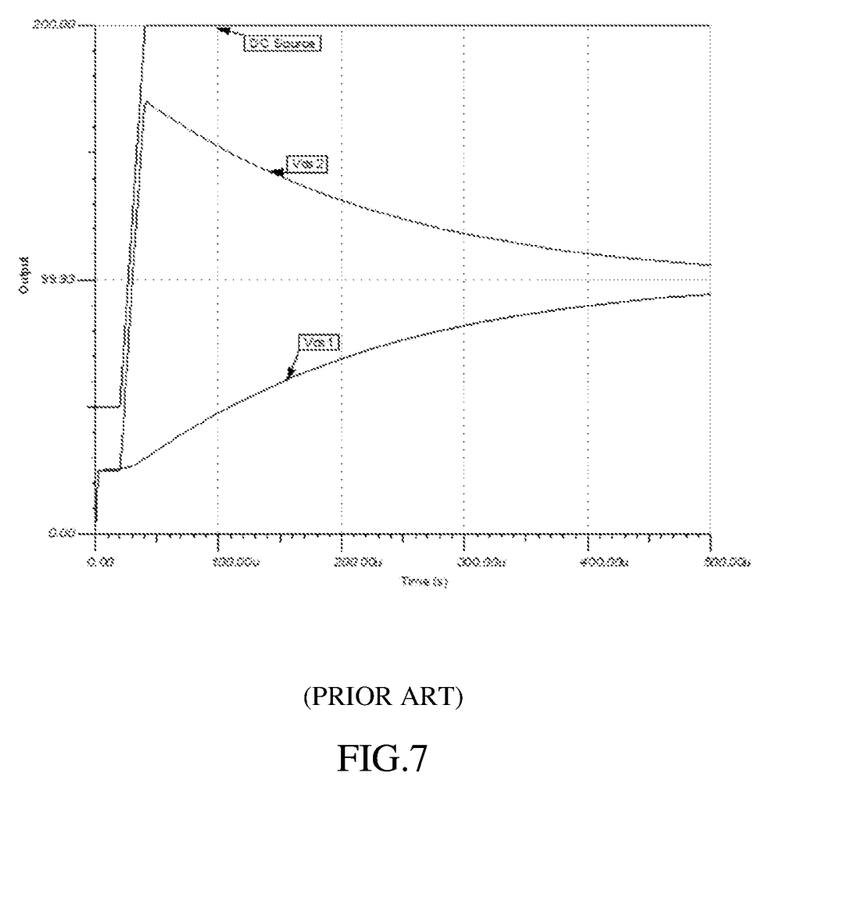
FIG. 7 (PRIOR ART) shows graphs of external voltage transient response time periods of a conventional electronic load system with dual power components.
Figure 8:
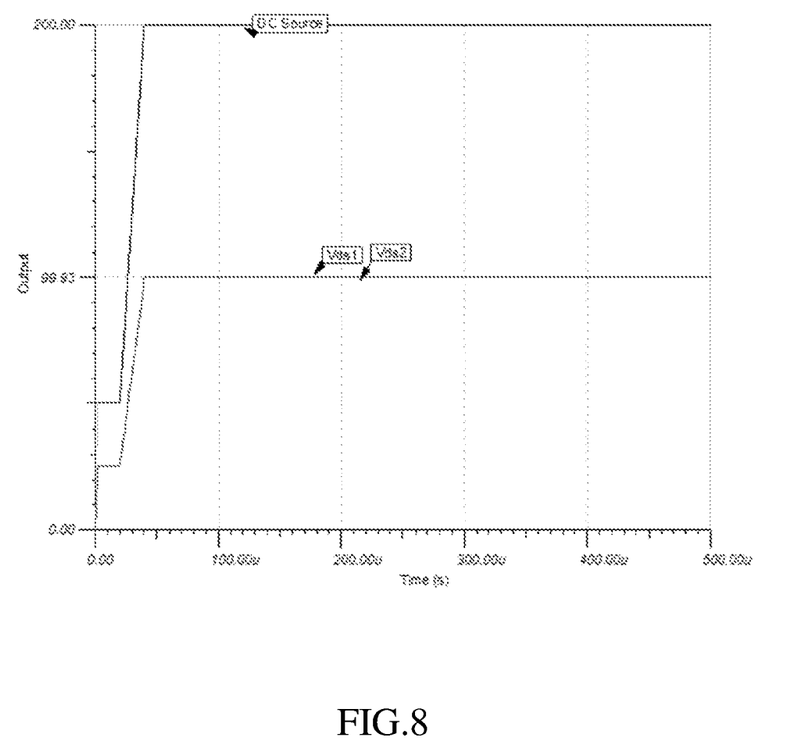
FIG. 8 shows graphs of external voltage transient response time periods of the electronic load system according to the embodiment illustrated by FIG. 5 of the present disclosure.

Refer to FIG. 7 and FIG. 8. FIG. 7 shows graphs of external voltage transient response time periods of a conventional electronic load system with dual power components. FIG. 8 shows graphs of external voltage transient response time periods of the electronic load system according to the embodiment illustrated by FIG. 5 of the present disclosure. The graph Vds1 shows cross voltage variation of the first power component in the electronic load apparatus, whereas the graph Vds2 shows cross voltage variation of the second power component in the electronic load apparatus, wherein DC Source is a voltage source under test. In the diagrams, the vertical axis represents voltage, and the horizontal axis represents time period. Referring to FIG. 7 and FIG. 8, in case of external voltage variation, the circuit framework of FIG. 5 enables two power components to be effectively sustained in a uniform voltage state. By contrast, as shown in FIG. 7, with the conventional circuit framework shown in FIG. 1, the two power components are not equal in terms of ON state (under the control of non-uniform voltage), and thus the first power component is slowly turned ON; thus, if the operating voltage of the electronic load apparatus is increased to overcome the voltage resistance of one single power component, the first power component will get damaged.

Figure 9:
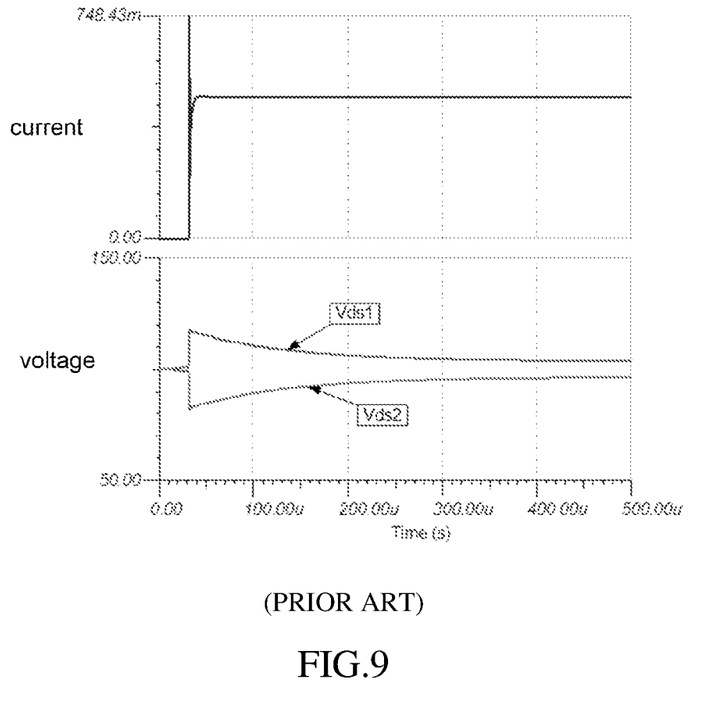
FIG. 9 (PRIOR ART) shows graphs of response time periods of the loaded conventional electronic load system with dual power components.
Figure 10:
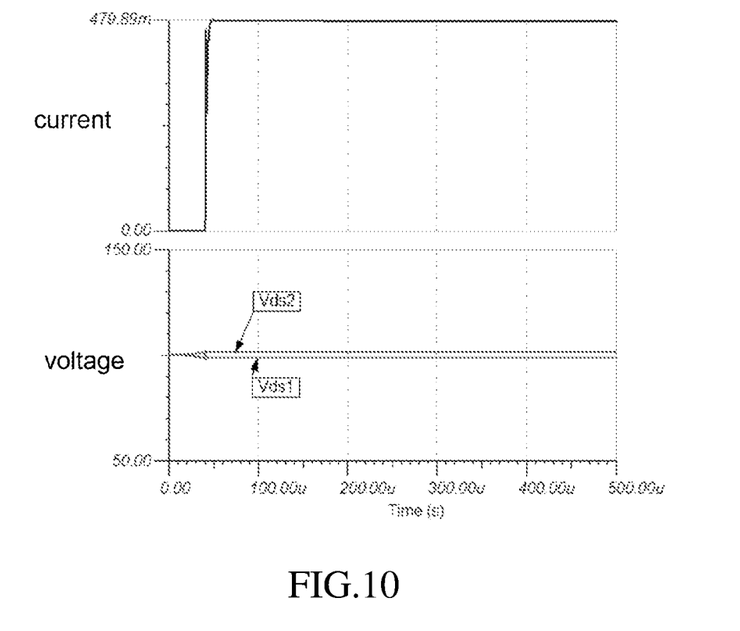
FIG. 10 shows graphs of response time periods of the loaded electronic load system according to the embodiment illustrated by FIG. 5 of the present disclosure.

Refer to FIG. 9 and FIG. 10. FIG. 9 shows graphs of response time periods of the loaded conventional electronic load system with dual power components. FIG. 10 shows graphs of response time periods of the loaded electronic load system according to the embodiment illustrated by FIG. 5 of the present disclosure. As shown in the diagrams, the upper half and lower half of the vertical axis represents current and voltage, respectively, and the horizontal axis represents time period. Referring to FIG. 9 and FIG. 10, when the electric power device under test provides a constant voltage, at the instantaneous moment, given the conventional circuit framework of FIG. 1, a voltage-dividing circuit must supply an extra current to the gate of the first power component to drive the first power component to turn it ON. However, to supply the current, the voltage-dividing circuit ends up in a non-uniform voltage state, leading to a lack of equilibrium between cross voltage Vds1 of the first power component and cross voltage Vds2 of the second power component; thus, if the operating voltage of the electronic load apparatus is increased to overcome the voltage resistance of one single power component, the power component will get damaged. By contrast, the circuit framework of FIG. 4 obviously eliminates the non-uniform voltage phenomenon.

Therefore, an enhanced driving circuit is disposed between a voltage-dividing circuit and power components to ensure the driving capability of the power components not coupled to a control circuit to thereby adjust a response voltage quickly, shorten a response time period and thus increase overall response speed, suppress transient variation and thus preclude a delay otherwise arising from a load circuit, allow the power components in an electronic load apparatus to be driven under uniform voltage quickly, reduce the risk of damaging the power components, and enhance the stability and reliability of the electronic load apparatus.

While the invention has been described by means of specific embodiments, numerous modifications and variations could be made thereto by those skilled in the art without departing from the scope and spirit of the invention set forth in the claims.

What is claimed is:

1. An electronic load apparatus, adapted to couple to an electric power device under test by an upper loop and a lower loop, the electronic load apparatus comprising:
   a voltage-dividing circuit coupled between the upper loop and the lower loop;
   a plurality of power components and a current sensing circuit, coupled between the upper loop and the lower loop and sequentially series-connected; and
   a control circuit coupled to one of the power components and coupled to the current sensing circuit,
   wherein an enhanced driving circuit is coupled between the voltage-dividing circuit and each of the other power components and adapted to amplify the preceding current to a succeeding current in a preceding region according to a preceding current received from the voltage-dividing circuit and by inputting an external electric power of the enhanced driving circuit, and then in a succeeding region of the enhanced driving circuit a voltage generated according to the succeeding current is applied to the corresponding power component.

2. The electronic load apparatus of claim 1, wherein the preceding region of the enhanced driving circuit comprises a current gain unit, and the succeeding region of the enhanced driving circuit comprises an impedance unit coupled between the current gain unit and the corresponding power component, wherein the current gain unit amplifies the preceding current to the succeeding current, and the impedance unit generates, according to the succeeding current, the control voltage for driving the corresponding power component.

3. The electronic load apparatus of claim 2, wherein the enhanced driving circuit further comprises a voltage clamping unit, has an input side defined with a first voltage level point, and has an output side defined with a second voltage level point, such that the voltage clamping unit is coupled between the first voltage level point and the second voltage level point and adapted to ensure that the voltage level of the second voltage level point is equal to the voltage level of the first voltage level point.

4. The electronic load apparatus of claim 3, wherein the voltage clamping unit functions as a path which is turned ON when the voltage level of the second voltage level point is greater than the voltage level of the first voltage level point by a threshold, so as to ground the second voltage level point.

5. The electronic load apparatus of claim 4, wherein the enhanced driving circuit is also coupled between the control circuit and the one of the power components and adapted to amplify a current transmitted by the control circuit and generate a voltage applied to the one of the power components.

6. The electronic load apparatus of claim 5, wherein the power components, the current sensing circuit, the control circuit, and the enhanced driving circuits together form a power stage, wherein a parallel connection driving circuit is coupled between the voltage-dividing circuit and the enhanced driving circuits and adapted to effect parallel-connection of the power stages, so as to increase a load current of the electronic load apparatus.

7. The electronic load apparatus of claim 6, wherein the parallel connection driving circuit has the same circuit framework as the current gain unit, amplifies a current transmitted by the voltage-dividing circuit, and provides the amplified current to the enhanced driving circuits connected to a back end.

\* \* \* \* \*